(12) United States Patent
Kung et al.

(10) Patent No.: US 10,122,141 B1
(45) Date of Patent: Nov. 6, 2018

(54) METHOD FOR MANUFACTURING ELECTRICAL CONNECTOR

(71) Applicant: LOTES CO., LTD, Keelung (TW)

(72) Inventors: Yung Sheng Kung, Keelung (TW); Yu Sheng Chen, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/869,663

(22) Filed: Jan. 12, 2018

(30) Foreign Application Priority Data

Jun. 16, 2017 (CN) .......................... 2017 1 0514037

(51) Int. Cl.
| | | |
|---|---|---|
| *H01R 12/00* | (2006.01) | |
| *H01R 43/02* | (2006.01) | |
| *H01R 43/20* | (2006.01) | |
| *H01R 43/16* | (2006.01) | |

(52) U.S. Cl.
CPC ..... *H01R 43/0256* (2013.01); *H01R 43/0235* (2013.01); *H01R 43/0263* (2013.01); *H01R 43/16* (2013.01); *H01R 43/205* (2013.01)

(58) Field of Classification Search
CPC ................ H01R 43/0256; H01R 43/16; H01R 43/0263; H01R 43/0235; H01R 43/205; H01L 23/49816; H01L 24/11; G03B 15/03
See application file for complete search history.

(56) References Cited

U.S. PATENT DOCUMENTS

| | | | | |
|---|---|---|---|---|
| 6,002,168 A * | 12/1999 | Bellaar | ............. | H01L 23/49816 |
| | | | | 257/693 |
| 6,083,013 A | 7/2000 | Yamagishi | | |
| 7,265,046 B2 * | 9/2007 | Kondo | ............. | H01L 23/49816 |
| | | | | 257/E21.476 |
| 7,621,762 B2 | 11/2009 | Liaw | | |
| 9,768,137 B2 * | 9/2017 | Chen | ....................... | H01L 24/11 |
| 2007/0259539 A1 * | 11/2007 | Brown | ................... | H01R 43/16 |
| | | | | 439/66 |

(Continued)

FOREIGN PATENT DOCUMENTS

| | | |
|---|---|---|
| CN | 1435914 A | 8/2003 |
| CN | 1445045 A | 10/2003 |
| CN | 2650922 Y | 10/2004 |

(Continued)

*Primary Examiner* — Jean F Duverne
(74) *Attorney, Agent, or Firm* — Locke Lord LLP; Tim Tingkang Xia, Esq.

(57) ABSTRACT

A method for manufacturing an electrical connector, including: S1: providing a bearing tray, where the bearing tray is concavely provided with multiple holding slots at intervals; S2: providing multiple solders correspondingly placed in the multiple holding slots; S3: heating the bearing tray, so as to soften the solders; S4: providing an insulating body and multiple terminals disposed at the insulating body, where each of the terminals has a soldering portion exposed from the insulating body, and moving the insulating body and the terminals entirely to the bearing tray, so that the soldering portion of each of the terminals is correspondingly inserted into a corresponding one of the softened solders; and S5: sticking the solder to the soldering portion, moving the insulating body away from above the bearing tray, and separating the solders from the bearing tray. The electrical connector has good electrical connection performance.

18 Claims, 8 Drawing Sheets

(56) References Cited

U.S. PATENT DOCUMENTS

2011/0255250 A1* 10/2011 Dinh .................. G03B 15/03
 361/749

FOREIGN PATENT DOCUMENTS

| | | |
|---|---|---|
| CN | 1177392 C | 11/2004 |
| CN | 1700534 A | 11/2005 |
| CN | 1276545 C | 9/2006 |
| CN | 101084607 A | 12/2007 |
| CN | 101369691 A | 2/2009 |
| CN | 100524974 C | 8/2009 |
| CN | 202067977 U | 12/2011 |
| CN | 102509990 A | 6/2012 |
| TW | 201342554 A | 10/2013 |

* cited by examiner

Providing a bearing tray, where the bearing tray is concavely provided with multiple holding slots at intervals

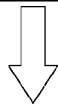

Providing multiple solders that are correspondingly placed in the holding slots

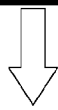

Heating the bearing tray, so as to soften the solders

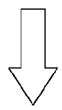

Providing an insulating body and multiple terminals disposed at the insulating body, where each of the terminals has a soldering portion protruding from the lower surface of the insulating body, and moving the insulating body and the terminals entirely to the bearing tray, so that the soldering portions are correspondingly inserted into the softened solders

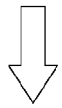

Sticking the solders to the soldering portions, moving the insulating body away from above the bearing tray, and separating the solders from the bearing tray

FIG. 5

METHOD FOR MANUFACTURING ELECTRICAL CONNECTOR

CROSS-REFERENCE TO RELATED PATENT APPLICATION

This application claims priority to and the benefit of, pursuant to 35 U.S.C. § 119(a), patent application Serial No. CN201710514037.X filed in China on Jun. 16, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present invention relates to a method for manufacturing an electrical connector, and in particular, to a method for manufacturing an electrical connector in which terminals are inserted into solders.

BACKGROUND

With rapid development of the electronic industry, performance requirements and structural strength requirements on electronic products are increasingly high. To ensure that an electrical connector in an electronic product can be firmly soldered to a circuit board, a frequently used practice in the industry is to enhance a soldering effect by solder balls. A conventional electrical connector includes an insulating body provided with multiple terminal slots, and multiple terminals fixedly disposed in the multiple terminal slots. One end of each terminal has an elastic contact portion protruding from a top surface of the insulating body to be in contact with a chip module, and the other end has a soldering portion soldered to a circuit board. Multiple solder balls are partially disposed in the multiple terminal slots, and each solder ball is clamped and fixed by both a side wall of the corresponding terminal slot and the soldering portion or is clamped and fixed only in dependence on the corresponding soldering portion itself, so that the solder ball can be fixed to the insulating body, and be in contact with the soldering portion. Therefore, the terminals may be soldered to the circuit board.

However, if each solder ball is clamped and fixed in dependence on both the side wall of the terminal slot and the soldering portion, that is, each solder ball resists the side wall of the terminal slot, when the electrical connector is soldered to the circuit board, heating processing needs to be performed on the solder balls. In this way, the solder balls are heated and swelled to extrude the terminal slots, so that the insulating body is deformed, or even warped. It is easy for the solder balls to drop, so that the soldering portions and the circuit board generate an empty solder, and moreover, it is easy to affect electrical contact between the elastic contact portion and the chip module, so that electrical connection performance of the electrical connector is poor. If each solder ball is clamped and fixed only in dependence on the soldering portion itself, the solder ball can be clamped only after the soldering portion is designed into a relatively complex structure. In this way, costs are relatively high. Moreover, each terminal is formed by punching or bending a metal plate material, and therefore the thickness of the terminal is relatively thin. A clamping force of the soldering portion is relatively weak, so that when the electrical connector is in a movement or transportation process, it is easy for the solder ball to drop, causing undesired soldering between the soldering portions and the circuit board.

Therefore, a heretofore unaddressed need to design a novel method for manufacturing an electrical connector exists in the art to address the aforementioned deficiencies and inadequacies.

SUMMARY

An inventive objective of the present invention is to provide a method for manufacturing an electrical connector, where a bearing tray is heated, so that multiple solders are softened, and then a soldering portion of a terminal is correspondingly inserted into a softened solder to prevent the solder from dropping, so as to ensure that the soldering portion is soldered well to a circuit board.

To achieve the foregoing objective, one aspect of the invention adopts the following technical solutions.

In one aspect, the present invention provides a method for manufacturing an electrical connector, including: S1: providing a bearing tray, wherein the bearing tray is concavely provided with a plurality of holding slots at intervals; S2: providing a plurality of solders correspondingly placed in the holding slots; S3: heating the bearing tray, so as to soften the solders; S4: providing an insulating body and a plurality of terminals disposed at the insulating body, wherein each of the terminals has a soldering portion exposed from the insulating body, and moving the insulating body and the terminals entirely to the bearing tray, so that the soldering portion of each of the terminals is correspondingly inserted into a corresponding one of the softened solders; and S5: sticking the solders to the soldering portions, moving the insulating body away from above the bearing tray, and separating the solders from the bearing tray.

In certain embodiments, in step S5, the insulating body is first moved away from above the bearing tray, and after the soldering portions bring the solders out of the holding slots, the solders are then cooled and cured, and the solders are fixedly connected to the soldering portions.

In certain embodiments, in step S5, the bearing tray is first stopped from being heated, and after the solders are cooled and cured in the holding slots, the solders are fixedly connected to the soldering portions, and then the insulating body is moved away from above the bearing tray.

In certain embodiments, in step S4, the soldering portions are inserted into the solders, and the solders wrap around the soldering portions.

In certain embodiments, in step S4, the soldering portions are inserted into edges of the solders, and at least one side surface of each of the soldering portions is exposed from the corresponding one of the solder.

In certain embodiments, each of the holding slots has a bottom surface, the bottom surface is an arc surface, and lowest points of the bottom surfaces are all located on a same horizontal plane; and after step S3, a bottom portion of each of the solders is correspondingly in contact with the lowest point of the bottom surface of each of the holding slots.

In certain embodiments, each of the holding slots has a bottom surface, each of the bottom surfaces is a flat surface, and the bottom surfaces of the holding slots are all located on a same horizontal plane; and after step S3, a bottom portion of each of the solders is correspondingly in contact with the bottom surface of each of the holding slots.

In certain embodiments, in step S4, the soldering portion protrudes from a lower surface of the insulating body, a standing leg is protrudingly provided downward from each of two sides of the lower surface of the insulating body, and a bottom end of the standing leg is lower than a lower end of the soldering portion and higher than a bottom end of each of the solders.

In certain embodiments, in step S4, an upper surface of the insulating body is downward concavely provided with a plurality of terminal slots, a lower surface of the insulating body is further upward concavely provided with a plurality of grooves corresponding to the terminal slots, a width of each of the grooves is greater than a width of each of the terminal slots, each of the terminals is fixed to a corresponding one of the terminal slots, the soldering portion of each of the terminals extends downward into a corresponding one of the grooves, a lower end of the soldering portion is higher than the lower surface of the insulating body, and each of the solders partially enters one of the grooves, so that the soldering portions are inserted into the solders.

In certain embodiments, in step S3, a temperature for heating the bearing tray is lower than a melting point of the solders.

In certain embodiments, in step S3, the bearing tray is heated by high-frequency current induction.

In certain embodiments, in step S1, the bearing tray is made of a solder-resistant plate material.

In certain embodiments, in step S1, each outer surface of the bearing tray is coated with a solder-resistant layer.

In certain embodiments, in step S4, each of the terminals defines a base portion fixed in the insulating body, an elastic contact portion bends upward and extends from the base portion and protrudes from an upper surface of the insulating body, a connection portion is downward protrudingly provided on the base portion and protrudes from a lower surface of the insulating body, the soldering portion is formed by extending downward from the connection portion, and the connection portion is provided with a siphon-proof structure.

In certain embodiments, the siphon-proof structure is an oxidation layer plated on a surface of the connection portion, or a solder mask layer coated on the surface of the connection portion.

In certain embodiments, after step S5, the electrical connector is soldered to a circuit board, and when the soldering portions are soldered and fixed to the circuit board, the soldering portions are correspondingly inserted into the solders at different depths.

In certain embodiments, after step S5, the electrical connector is soldered to a circuit board, and when the soldering portions are soldered and fixed to the circuit board, heights of the solders are different.

In certain embodiments, the solders are solder balls, solder bars or solder pastes.

Compared with the related art, in the method for manufacturing an electrical connector according to certain embodiments of the present invention, the bearing tray is heated, so that the solders are softened. The insulating body and the terminals are entirely moved to the bearing tray, so that the soldering portions are correspondingly inserted into the softened solders, and the solders are stuck to the soldering portions, thereby avoiding the solders from being heated to extrude the insulating body and cause the insulating body to deform and then affect accurate electrical contact between the terminal and the chip module, so as to ensure that the electrical connector has good electrical connection performance. Moreover, the structure of the soldering portion is simplified, manufacturing costs of the terminals are reduced, and a problem that the solder drops due to an insufficient clamping force is effectively prevented. The soldering portions are prevented from empty soldering and missing soldering, so that the soldering portions and the circuit board are soldered well. Additionally, the bearing tray is first heated, and then the soldering portions are inserted into the solder ball, thereby effectively preventing the insulating body from being directly heated to be severely deformed and warped, so that entire soldering flatness of the multiple soldering portions is relatively good, and product quality of the electrical connector is improved.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment.

FIG. 5 is a flowchart of a method for manufacturing an electrical connector according to one embodiment of the present invention;

DETAILED DESCRIPTION

Figure 1:
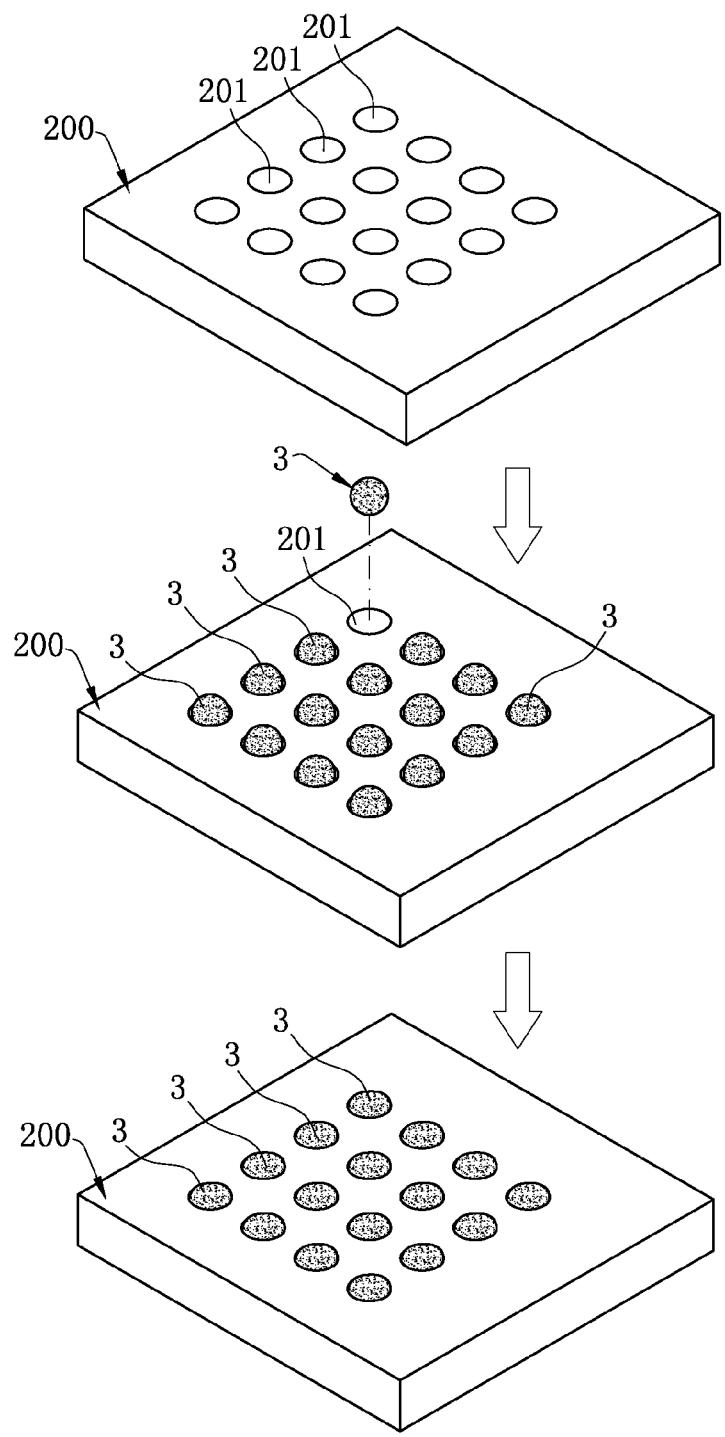
FIG. 1 is a schematic view of solders installed at a bearing tray according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to a method for manufacturing an electrical connector.

Figure 4:
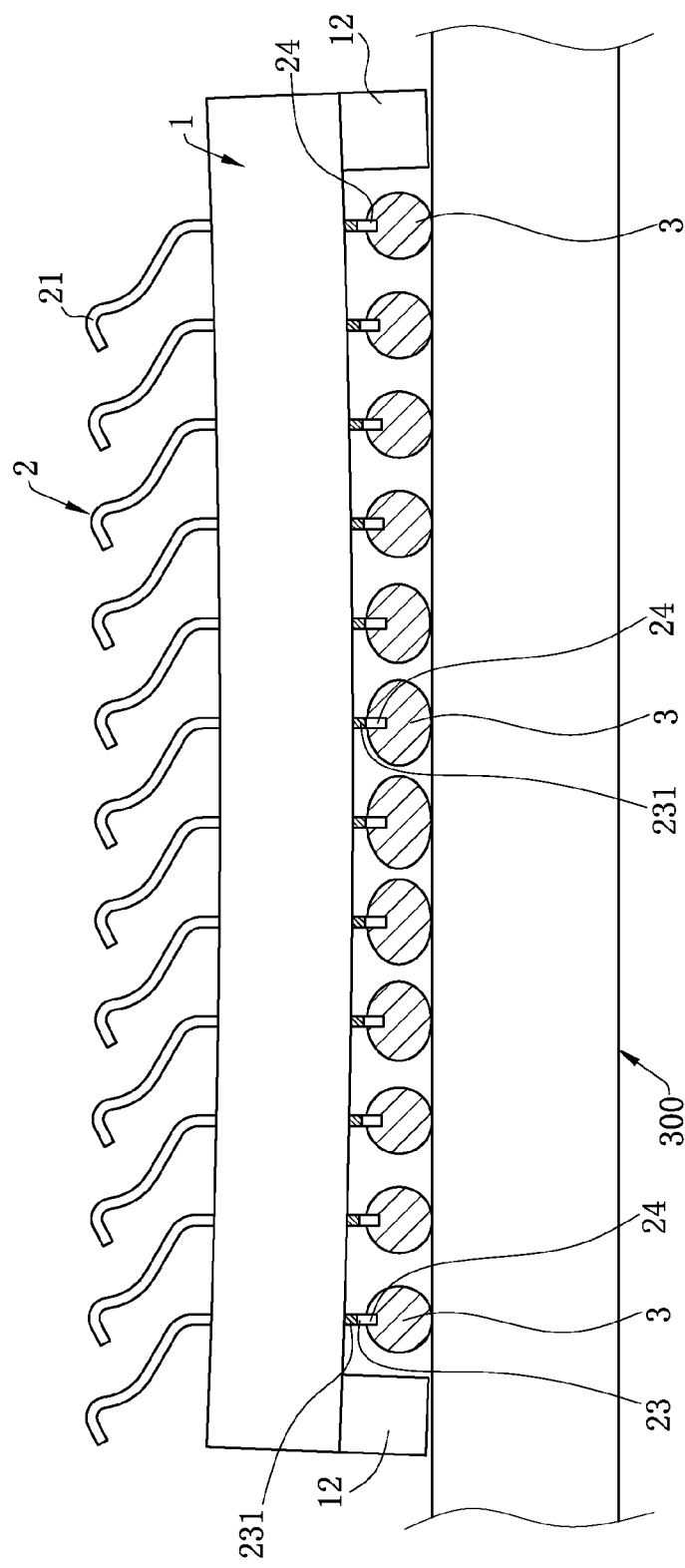
FIG. 4 is a schematic structural view of an electrical connector soldered to a circuit board according to one embodiment of the present invention.

As shown in FIG. 1 and FIG. 4, a method for manufacturing an electrical connector of the present invention includes: S1: providing a bearing tray 200, where the bearing tray 200 is concavely provided with multiple holding slots 201 at intervals; S2: providing multiple solders 3 that are correspondingly placed in the holding slots 201; S3: heating the bearing tray 200, so as to soften the solders 3; S4: providing an insulating body 1 and multiple terminals 2 disposed at the insulating body 1, where each of the terminals 2 has a soldering portion 24 exposed from the insulating body 1, and moving the insulating body 1 and the terminals 2 entirely to the bearing tray 200, so that the soldering portions 24 are correspondingly inserted into the softened solders 3; and S5: sticking the solders 3 to the soldering portions 24, moving the insulating body 1 away from above the bearing tray 200, and separating the solders 3 from the bearing tray 200. Therefore, the solders 3 are fixed to the soldering portions 24, so as to manufacture the electrical connector. An upper end of the electrical connector is used to be in electrical contact with a chip module (not shown), a lower end of the electrical connector is used to be soldered to a circuit board 300, and the solders 3 are used to solder and fix the soldering portions 24 to the circuit board 300.

Figure 2:
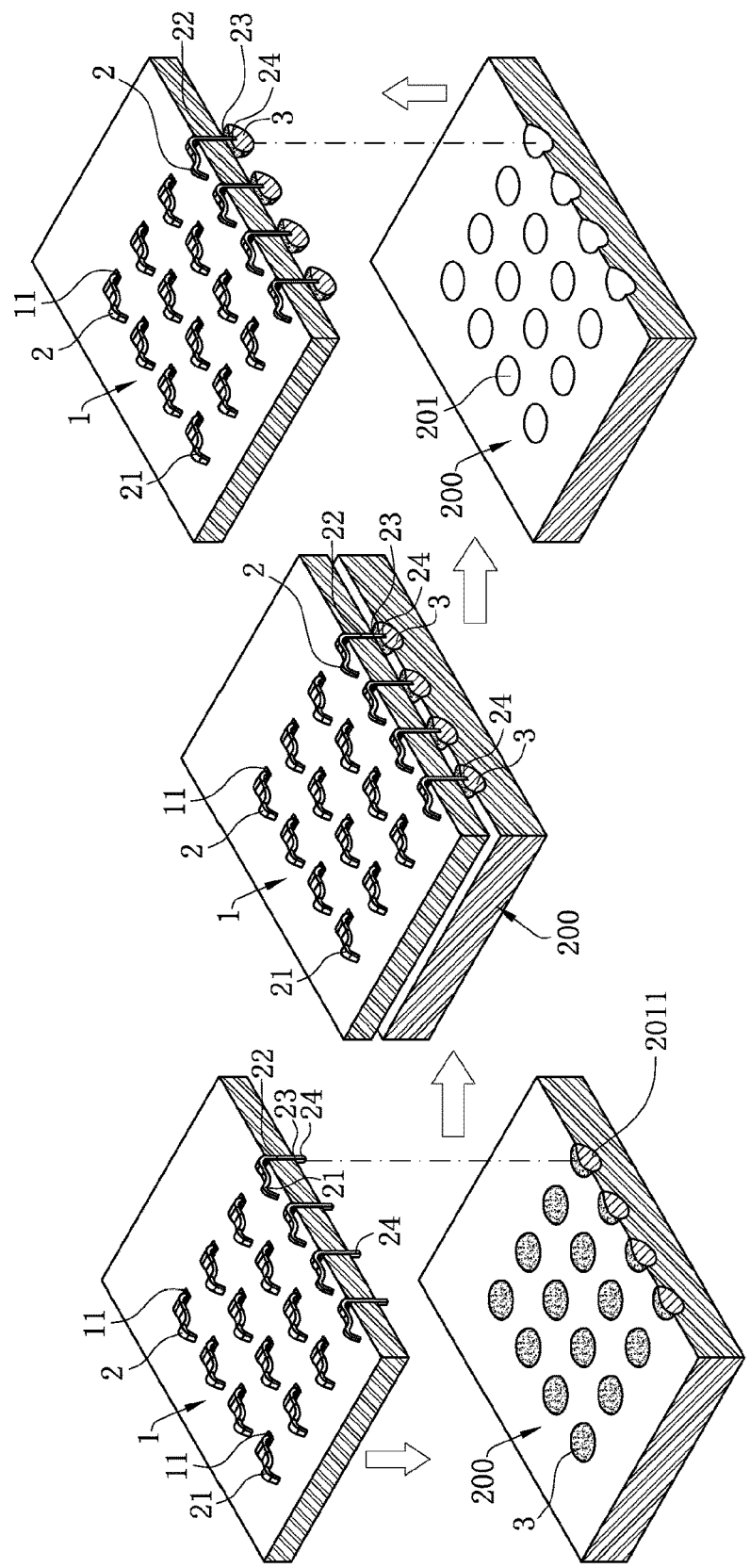
FIG. 2 is a schematic three-dimensional structural view of a process of a method for manufacturing an electrical connector according to one embodiment of the present invention.
Figure 3:
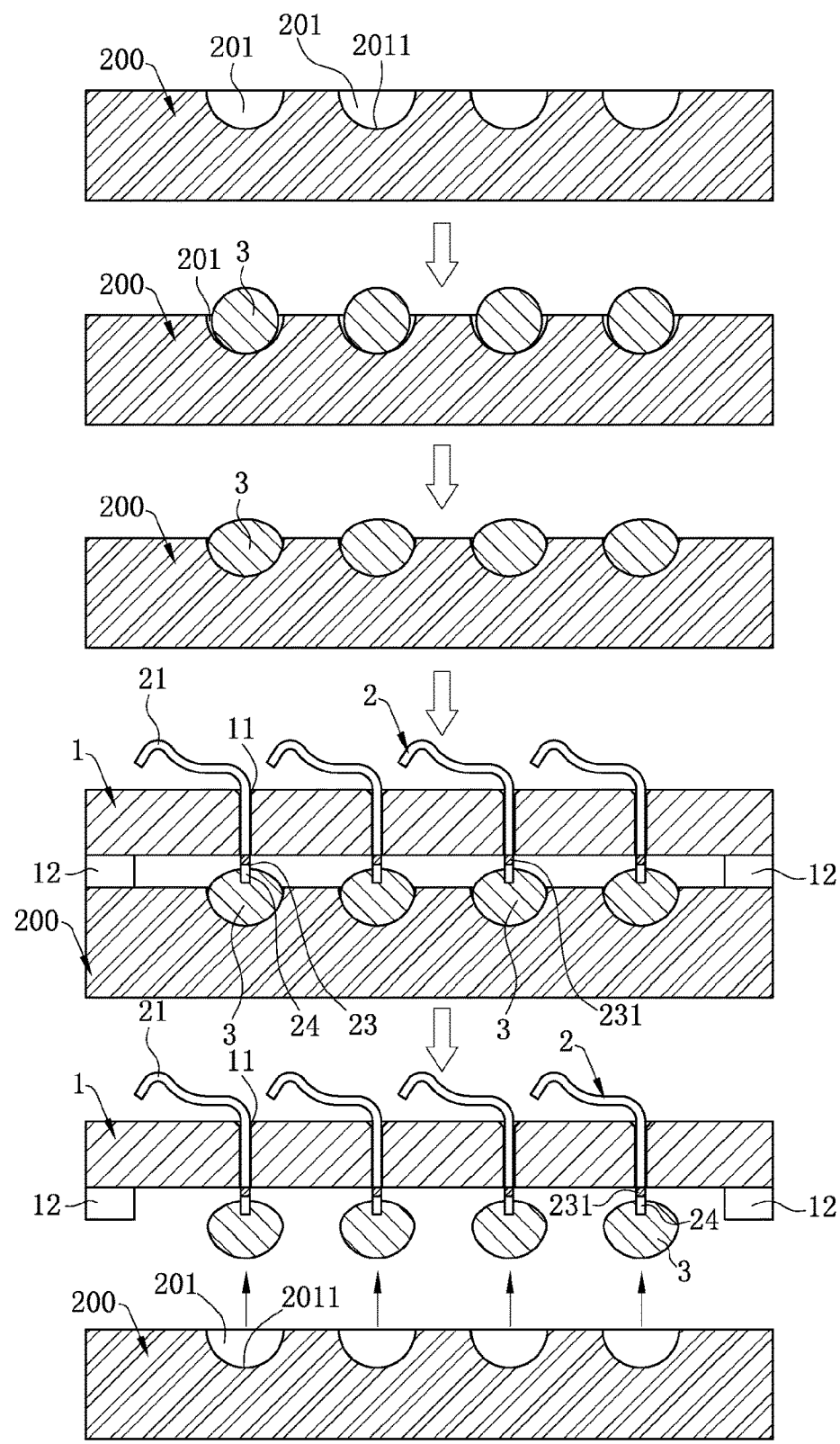
FIG. 3 is a schematic sectional view of a process of a method for manufacturing an electrical connector according to one embodiment of the present invention.

As shown in FIG. 1 to FIG. 3, the bearing tray 200 is made of a metal material, so that the bearing tray 200 has good heat conduction performance. Moreover, the bearing tray 200 is made of a solder-resistant plate material, and therefore has solder-resistant characteristics, so that after being softened, the solders 3 do not adhere to the surface of the bearing tray 200, thereby reducing the use amount of the solders 3 being used, reducing manufacturing costs, and ensuring that the solders 3 have good coplanarity. In this embodiment, the bearing tray 200 is made of a solder-resistant plate material. In other embodiments, the outer surface of the bearing tray 200 is coated with a solder-resistant layer, so that the bearing tray 200 has solder-resistant characteristic. The upper surface of the bearing tray 200 is a smooth surface, and the holding slots 201 are downward concavely provided on the upper surface of the bearing tray 200. Each of the holding slots 201 has a bottom surface 2011. The bottom surface 2011 is an arc surface, and lowest points of the bottom surfaces 2011 are all located on a same horizontal plane, and the bottom portion of each of the solders 3 in step S3 is correspondingly in contact with the lowest point of the bottom surface 2011 of each of the holding slots 201, so that the bearing tray 200 can make the bottom portion of the solder 3 to form into a sphere shape. Further, the lowest points of the solders 3 are all located on a same horizontal plane, thereby ensuring that positions of the solders 3 relative to the insulating body 1 are all on a same horizontal plane, to help improve reliability of soldering between the electrical connector and the circuit board 300. In this embodiment, the solders 3 are solder balls, and the bottom portion of each solder 3 is an arc surface. In other embodiments, the solders 3 may be solder pastes or solder bars in any shape.

As shown in FIG. 1 to FIG. 3, the insulating body 1 is roughly square, and an upper surface of the insulating body 1 is downward concavely provided with a plurality of terminal slots 11. The terminal slots 11 run through downward from the upper surface of the insulating body 1 to a lower surface of the insulating body 1. The terminal slots 11 are arranged into multiple rows on the insulating body 1, and the terminals 2 are installed downward from the top into the terminal slots 11, so that the terminals 2 are arranged into multiple rows on the insulating body 1. A standing leg 12 protrudes downward from each of two sides of the lower surface of the insulating body 1. Each of the terminals 2 defines a base portion 22 fixed in the insulating body 1. An elastic contact portion 21 bends upward and extends from the base portion 22 and protrudes from the upper surface of the insulating body 1, the elastic contact portion 21 is used to elastically urge against the chip module to perform electrical connection. A connection portion 23 protrudes vertically downward from the base portion 22 and protrudes from the lower surface of the insulating body 1, and the soldering portion 24 is formed by extending vertically downward from the connection portion 23. In other embodiments, the soldering portion 24 may be in a bending shape. The connection portion 23 protrudes from the lower surface of the insulating body 1, so that the soldering portion 24 protrudes from the lower surface of the insulating body 1. Therefore, the soldering portion 24 is located at the outer side of the insulating body 1, so as to help insert the soldering portion 24 into the solder 3. The soldering portion 24 is located in the solder 3. That is, the solder 3 wraps around the soldering portion 24. The softened solders 3 can be stably attached to the soldering portions 24, and after the solders 3 are cooled and cured, the solders 3 is still firmly fixed onto the soldering portions 24, thereby avoiding the solders 3 from being heated to extrude the insulating body 1 and cause the insulating body 1 to deform and then affect accurate electrical contact between the terminal 2 and the chip module, and ensuring that the electrical connector has good electrical connection performance. Moreover, the structure of the soldering portion 24 is simplified, manufacturing costs of the terminal 2 are reduced, and a problem that the solder 3 drops due to an insufficient clamping force is effectively prevented, The soldering portions 24 are prevented from empty soldering and missing soldering, so that the soldering portions 24 and the circuit board 300 are soldered well.

As shown in FIG. 2 to FIG. 4, the connection portion 23 is provided with a siphon-proof structure 231. The siphon-proof structure 231 can prevent the solder 3 from climbing from the soldering portion 24 to the connection portion 23, and then climbing to the base portion 22 to contaminate the terminal slot 11, and avoid a case in which the solder amount at the soldering portion 24 is insufficient to cause unstable soldering between the soldering portion 24 and the circuit board 300. In this embodiment, the siphon-proof structure 231 is an oxidation layer plated on a surface of the connection portion 23. In another embodiment, the siphon-proof structure 231 may be a solder mask layer coated on the surface of the connection portion 23. In other embodiments, the siphon-proof structure 231 may be a recess portion (not shown) concavely provided on a surface of the connection portion 23. In this embodiment, the connection portion 23 is disposed between the soldering portion 24 and the base portion 22. In other embodiments, the soldering portion 24 may be formed by directly extending downward from the base portion 22, and the siphon-proof structure 231 may be disposed at the base portion 22.

As shown in FIG. 2 to FIG. 4, the standing leg 12 protrudes from each of two sides of the insulating body 1, and the bottom end of the standing leg 12 is lower than the lower end of the soldering portion 24 and higher than the bottom end of the solder 3. Because the bottom end of the standing leg 12 is lower than the lower end of the soldering portion 24, when the soldering portion 24 is inserted into the solder 3, the standing leg 12 abuts the upper surface of the bearing tray 200, to avoid a case in which the soldering portion 24 runs through the bottom portion of the solder 3 to affect soldering between the soldering portion 24 and the circuit board 300. When the soldering portion 24 is soldered to the circuit board 300, because the bottom end of the standing leg 12 is higher than the bottom end of the solder 3, it is ensured that the solder 3 can be in contact with the circuit board 300 to firmly solder the soldering portion 24 to the circuit board 300, to avoid a case in which a distance between the solder 3 and the circuit board 300 is excessively large to cause undesired soldering. Moreover, the standing leg 12 positions the electrical connector onto the circuit board 300, to avoid loosing of the soldering portion 24.

As shown in FIG. 2, FIG. 3 and FIG. 5, the method for manufacturing an electrical connector of the present invention includes the following steps:

S1: Providing a bearing tray 200, where the bearing tray 200 is concavely provided with multiple holding slots 201 at intervals. In this step, the bottom surface 2011 of each holding slot 201 is an arc surface, and the lowest points of the bottom surfaces 2011 of the holding slots 201 are all located on a same horizontal plane.

Then, perform step S2: providing multiple solders 3 that are correspondingly placed in the multiple holding slots 201.

Then, perform step S3: heating the bearing tray 200, so as to soften the solders 3. In this step, the bearing tray 200 is heated by high-frequency current induction, so that the temperature of the bearing tray 200 can quickly increase. Therefore, the heating speed is high, and the heating time is relatively short, thereby improving production efficiency. Moreover, in this embodiment, the temperature for heating the bearing tray 200 is lower than the melting point of the solders 3, and the melting point of the solders 3 is 217±1° C. That is, the heating temperature is lower than 217° C., so that the solders 3 are only softened, but not melted into a liquid, so as to facilitate operations, to prevent the solders 3 from overflowing and flowing into the surface of the bearing tray 200, which reduces the solder amount of the solders 3 in the holding slots 201. In other embodiments, the temperature for heating the bearing tray 200 may be higher than or equal to the melting point of the solders 3, as long as it is ensured that the solders 3 are only softened but not melted. Additionally, the bottom portion of each softened solder 3 is in contact with the corresponding bottom surface 2011 of the holding slot 201, so that the bottom portion of each solder 3 is an arc surface.

Then, perform step S4: providing the insulating body 1 and the terminals 2 disposed at the insulating body 1, where each of the terminals 2 has the soldering portion 24 protruding from the lower surface of the insulating body 1, and moving the insulating body 1 and the terminals 2 entirely to the bearing tray 200, so that the soldering portions 24 are correspondingly inserted into the softened solders 3. In this step, the soldering portion 24 is aligned with the center of the solder 3 and is inserted vertically downward into the solder 3, so that the solder 3 wraps around the soldering portion 24. The soldering portion 24 is located in the solder 3, so that the solder 3 can be stably attached to the soldering portion 24. The bearing tray 200 is first heated and then the soldering portion 24 is inserted into the solder 3, thus effectively preventing the insulating body 1 from being directly heated and severely deformed and warped, so that entire soldering flatness of the multiple soldering portions 24 is relatively good, thereby improving product quality of the electrical connector.

Then, perform step S5: sticking the solder 3 to the soldering portion 24, moving the insulating body 1 away from above the bearing tray 200, and separating the solder 3 from the bearing tray 200. Therefore, the solders 3 are fixedly connected to the soldering portions 24. In this embodiment, the bearing tray 200 is first stopped from being heated, and after the solders 3 are cooled and cured in the holding slots 201, the solders 3 are fixed to the soldering portions 24, and then the insulating body 1 is moved away from above the bearing tray 200. In other embodiments, the insulating body 1 may be first moved away from above the bearing tray 200, and after each soldering portion 24 brings the solder 3 out of the holding slot 201, the solders 3 are then cooled and cured. The solders 3 are fixedly connected to the soldering portions 24, as long as it is ensured that the solders 3 are fixed to the soldering portions 24 and separated from the bearing tray 200.

After step S5, the electrical connector is soldered to the circuit board 300 by the solders 3. The solders 3 need to be heated again to be melt during soldering. In this case, it is easy for the insulating body 1 to be slightly warped to cause different heights of the soldering portions 24. Therefore, when the soldering portions 24 are soldered and fixed to the circuit board 300, the soldering portions 24 are correspondingly inserted into the solders 3 at different depths. That is, the depth at which a soldering portion 24 located in the middle of the insulating body 1 is inserted into the corresponding solder 3 is different from the depth at which another soldering portion 24 located at an edge of the insulating body 1 is inserted into the corresponding solder 3. In this embodiment, the middle of the insulating body 1 bends downward, while the edge of the insulating body 1 warps upward, and therefore the depth at which the soldering portion 24 located in the middle of the insulating body 1 is inserted into the solder 3 is greater than the depth at which the soldering portion 24 located at the edge of the insulating body 1 is inserted into the solder 3. Moreover, due to the slight warping of the insulating body 1, heights of the solders 3 after final soldering may be different, thereby ensuring that the solders 3 and soldering points of the circuit board 300 are completely flush, and ensuring that the soldering portions 24 and the circuit board 300 are effectively soldered.

Figure 6:
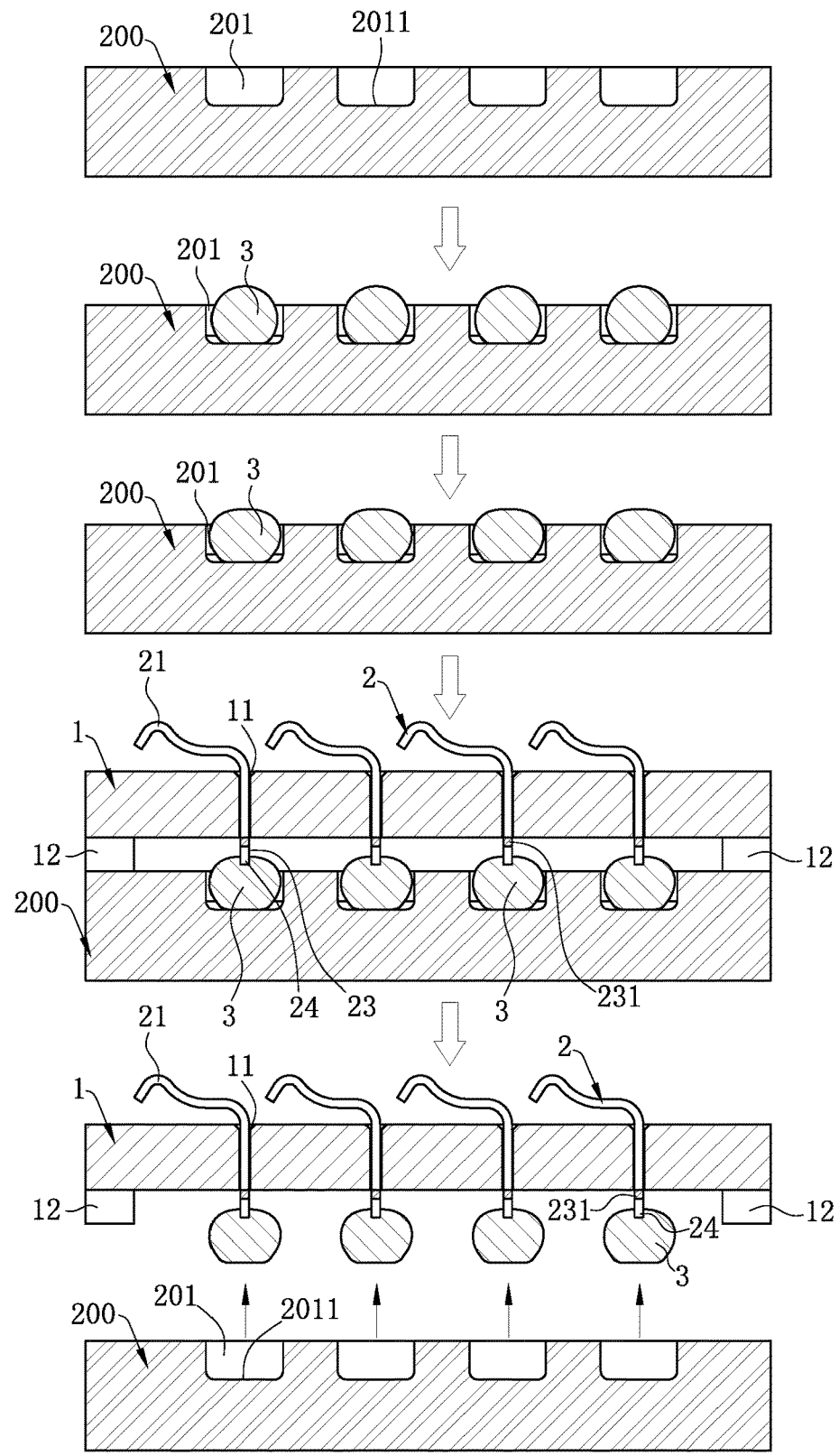
FIG. 6 is a schematic sectional view of a process of a method for manufacturing an electrical connector according to a second embodiment of the present invention.

FIG. 6 shows a second embodiment of the present invention. The second embodiment differs from the first embodiment in that, the bottom surface 2011 of each holding slot 201 is not formed as an arc surface. Instead, the bottom surface 2011 is formed as a flat surface. The bottom surface 2011 of each of the holding slots 201 of the bearing tray 200 is a flat surface, and the bottom surfaces 2011 are all located on a same horizontal plane. After step S3, the solders 3 are softened, so that the bottom portion of each of the solders 3 is correspondingly in contact with the bottom surface 2011 of each of the holding slots 201. Therefore, the bearing tray 200 can make the bottom portion of the solder 3 be formed into a flat surface, and the bottom portions of the solders 3 are all flat surfaces, so that the bottom portions of the solders 3 have relatively good coplanarity. Likewise, the positions of the solders 3 relative to the insulating body 1 are all on a same horizontal plane, so as to help improve reliability of soldering between the electrical connector and the circuit board 300.

Figure 7:
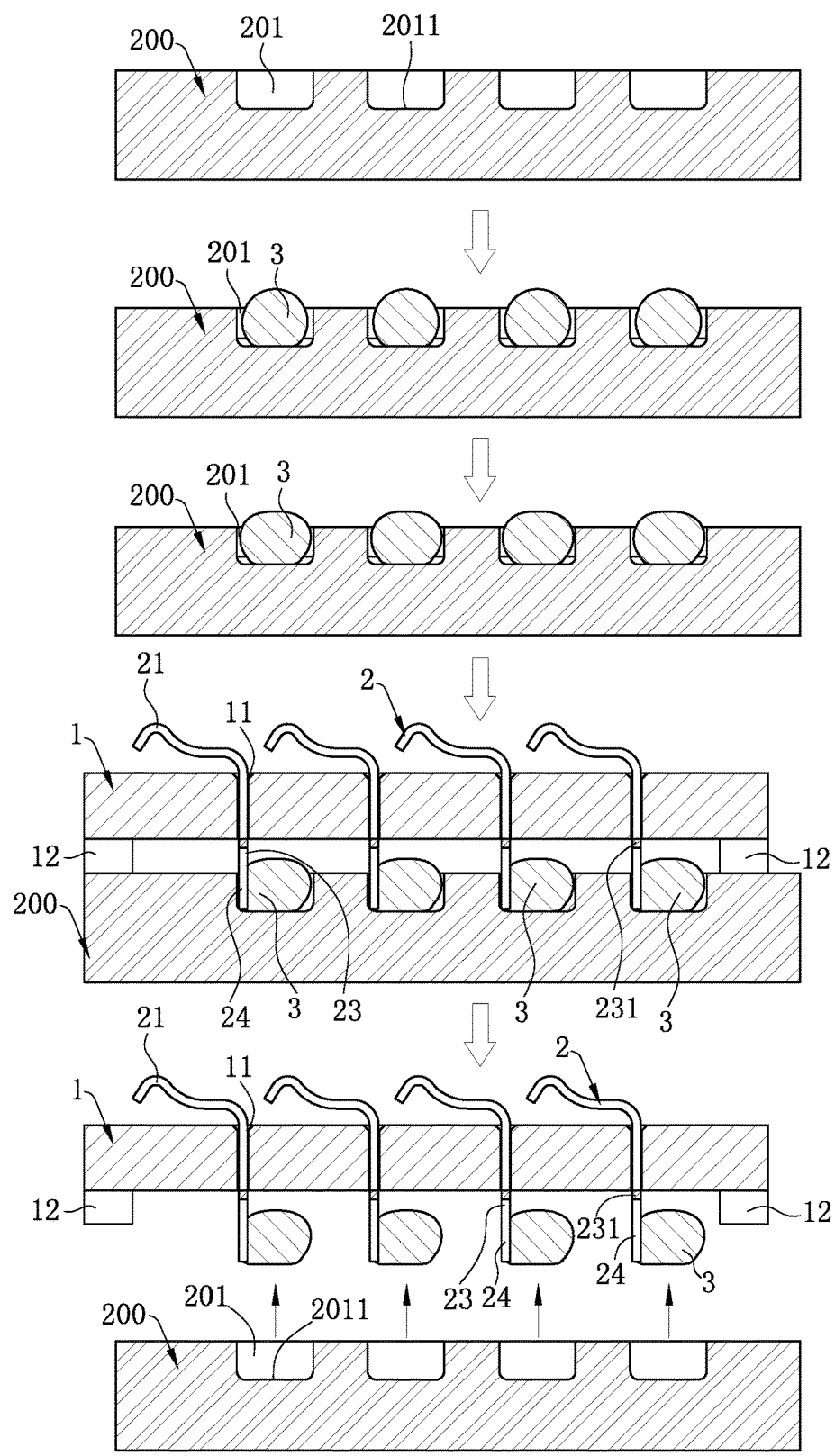
FIG. 7 is a schematic sectional view of a process of a method for manufacturing an electrical connector according to a third embodiment of the present invention.

FIG. 7 shows a third embodiment of the present invention. The third embodiment differs from the first embodiment in that, the bottom surface 2011 of each holding slot 201 of the bearing tray 200 is not formed as an arc surface. Instead, the bottom surface 2011 of each holding slot 201 of the bearing tray 200 is a flat surface, and therefore after being softened, the solders 3 are in contact with the bottom surfaces 2011 of the holding slots 201. The bottom surface 2011 of each solder 3 is a flat surface. Moreover, in step S4, the soldering portion 24 is inserted into the edge of the solder 3. That is, the soldering portion 24 is not completely inserted into the solder 3, and at least one side surface of the soldering portion 24 is exposed from the solder 3. Because tin in the softened solder 3 extends toward the soldering portion 24, even if the soldering portion 24 is inserted into the edge of the solder 3, it can be ensured that the soldering portion 24 is partially located in the solder 3. Likewise, the solders 3 can be stably attached to the soldering portions 24. Moreover, after the solders 3 are cooled and cured, the solders 3 are still firmly fixed to the soldering portions 24, and the problem of dropping of the solders 3 does not occur. In this embodiment, the soldering portion 24 has only a side surface exposed from the solder 3. In other embodiments, the soldering portion 24 may have two side surfaces or three side surfaces exposed from the solder 3, as long as it is ensured that the solder 3 can be attached to the soldering portion 24.

Figure 8:
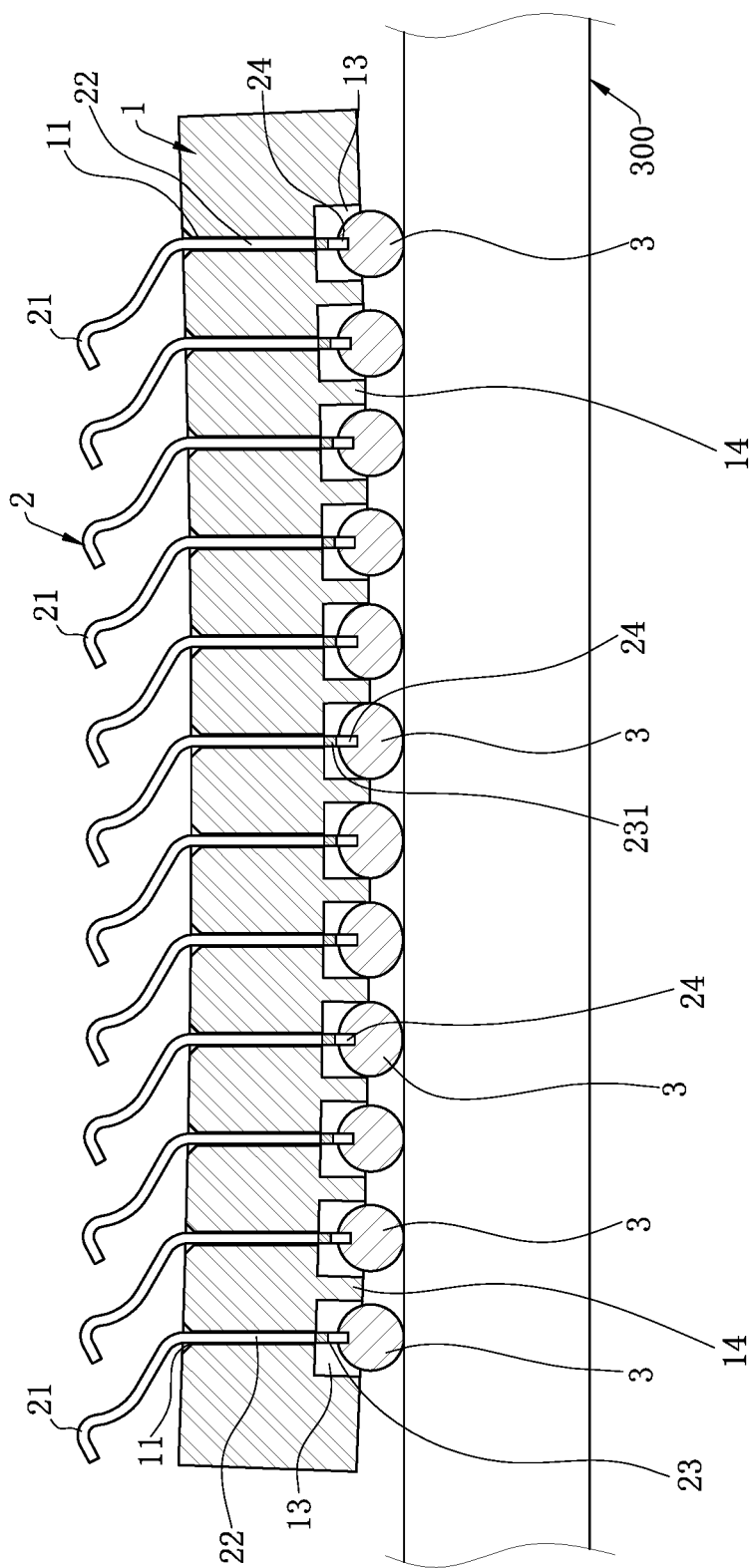
FIG. 8 is a schematic structural view of an electrical connector soldered to a circuit board according to a fourth embodiment of the present invention.

FIG. 8 shows a fourth embodiment of the present invention. The fourth embodiment differs from the first embodiment in that, the soldering portions 24 do not protrude from the lower surface of the insulating body 1. Instead, the lower surface of the insulating body 1 is further upward concavely provided with a plurality of grooves 13 corresponding to the terminal slots 11. A width of each groove 13 is greater than a width of each terminal slot 11, and the groove 13 and the terminal slot 11 are in communication. Each of the terminals 2 is fixed in the terminal slot 11, and the soldering portion 24 extends downward into the corresponding groove 13, so as to be exposed from the insulating body 1. The lower end of the soldering portion 24 is higher than the lower surface of the insulating body 1, and the solder 3 partially enters the groove 13, so that it is convenient for the soldering portion 24 to be inserted into the solder 3. Therefore, the soldering portion 24 extends into the groove 13 and can also be smoothly inserted into the solder 3. Likewise, the soldering portions 24 are firmly soldered to the circuit board 300 by the solders 3, to avoid the problem that the distance between the solders 3 and the circuit board 300 is excessively large to cause undesired soldering. The insulating body 1 is provided with a stop wall 14 between each two adjacent grooves 13. When the electrical connector is soldered to the circuit board 300, the solders 3 need to be heated, so that the solders 3 are melted. The stop walls 14 are used to stop the melted solder liquid from flowing into a neighboring solder 3 to generate a solder bridge, so as to avoid the risk of short-circuiting.

The method for manufacturing an electrical connector according to certain embodiments of the present invention has the following beneficial effects:

1. The bearing tray 200 is heated, so that the solders 3 are softened. The insulating body 1 and the terminals 2 are entirely moved to the bearing tray 200, so that the soldering portions 24 are correspondingly inserted into the softened solders 3. Therefore, the solders 3 are stuck to the soldering portions 24, thereby avoiding the solders 3 from being heated to extrude the insulating body 1 and cause the insulating body 1 to deform and then affect accurate electrical contact between the terminal 2 and the chip module, and ensuring that the electrical connector has good electrical connection performance. Moreover, the structure of the soldering portion 24 is simplified, manufacturing costs of the terminal 2 are reduced, and a problem that the solder 3 drops due to an insufficient clamping force is effectively prevented, The soldering portions 24 are prevented from empty soldering and missing soldering, so that the soldering portions 24 and the circuit board 300 are soldered well.

2. The bearing tray 200 is first heated and then the soldering portion 24 is inserted into the solder 3, thus effectively preventing the insulating body 1 from being directly heated and severely deformed and warped, so that entire soldering flatness of the multiple soldering portions 24 is relatively good, thereby improving product quality of the electrical connector.

3. The bottom surface 2011 is an arc surface, and lowest points of the bottom surfaces 2011 are all located on a same horizontal plane, and the bottom portion of each of the solders 3 in step S3 is correspondingly in contact with the lowest point of the bottom surface 2011 of each of the holding slots 201, so that the bearing tray 200 can make the bottom portion of the solder 3 to form into a sphere shape. Further, the lowest points of the solders 3 are all located on a same horizontal plane, thereby ensuring that positions of the solders 3 relative to the insulating body 1 are all on a same horizontal plane, to help improve reliability of soldering between the electrical connector and the circuit board 300.

4. The connection portion 23 is provided with a siphon-proof structure 231. The siphon-proof structure 231 can prevent the solder 3 from climbing from the soldering portion 24 to the connection portion 23, and then climbing to the base portion 22 to contaminate the terminal slot 11, and avoid a case in which the solder amount at the soldering portion 24 is insufficient to cause unstable soldering between the soldering portion 24 and the circuit board 300.

5. Because the bottom end of the standing leg 12 is lower than the lower end of the soldering portion 24, when the soldering portion 24 is inserted into the solder 3, the standing leg 12 abuts the upper surface of the bearing tray 200, to avoid a case in which the soldering portion 24 runs through the bottom portion of the solder 3 to affect soldering between the soldering portion 24 and the circuit board 300. When the soldering portion 24 is soldered to the circuit board 300, because the bottom end of the standing leg 12 is higher than the bottom end of the solder 3, it is ensured that the solder 3 can be in contact with the circuit board 300 to firmly solder the soldering portion 24 to the circuit board 300, to avoid a case in which a distance between the solder 3 and the circuit board 300 is excessively large to cause undesired soldering. Moreover, the standing leg 12 positions the electrical connector onto the circuit board 300, to avoid loosing of the soldering portion 24.

The above detailed description only describes preferable embodiments of the present invention, and is not intended to limit the patent scope of the present invention, so any equivalent technical changes made by use of the specification of the creation and the content shown in the drawings fall within the patent scope of the present invention.

While there has been shown several and alternate embodiments of the present invention, it is to be understood that certain changes can be made as would be known to one skilled in the art without departing from the underlying scope of the present invention as is discussed and set forth above and below including claims. Furthermore, the embodiments described above and claims set forth below are only intended to illustrate the principles of the present invention and are not intended to limit the scope of the present invention to the disclosed elements.

What is claimed is:

1. A method for manufacturing an electrical connector, comprising:
    S1: providing a bearing tray, wherein the bearing tray is concavely provided with a plurality of holding slots at intervals;
    S2: providing a plurality of solders correspondingly placed in the holding slots;
    S3: heating the bearing tray, so as to soften the solders;
    S4: providing an insulating body and a plurality of terminals disposed at the insulating body, wherein each of the terminals has a soldering portion exposed from the insulating body, and moving the insulating body and the terminals entirely to the bearing tray, so that the soldering portion of each of the terminals is correspondingly inserted into a corresponding one of the softened solders; and
    S5: sticking the solders to the soldering portions, moving the insulating body away from above the bearing tray, and separating the solders from the bearing tray.

2. The method for manufacturing an electrical connector according to claim 1, wherein in step S5, the insulating body is first moved away from above the bearing tray, and after the soldering portions bring the solders out of the holding slots, the solders are then cooled and cured, and the solders are fixedly connected to the soldering portions.

3. The method for manufacturing an electrical connector according to claim 1, wherein in step S5, the bearing tray is first stopped from being heated, and after the solders are cooled and cured in the holding slots, the solders are fixedly connected to the soldering portions, and then the insulating body is moved away from above the bearing tray.

4. The method for manufacturing an electrical connector according to claim 1, wherein in step S4, the soldering portions are inserted into the solders, and the solders wrap around the soldering portions.

5. The method for manufacturing an electrical connector according to claim 1, wherein in step S4, the soldering portions are inserted into edges of the solders, and at least one side surface of each of the soldering portions is exposed from the corresponding one of the solder.

6. The method for manufacturing an electrical connector according to claim 1, wherein each of the holding slots has a bottom surface, the bottom surface is an arc surface, and lowest points of the bottom surfaces are all located on a same horizontal plane; and after step S3, a bottom portion of each of the solders is correspondingly in contact with the lowest point of the bottom surface of each of the holding slots.

7. The method for manufacturing an electrical connector according to claim 1, wherein each of the holding slots has a bottom surface, each of the bottom surfaces is a flat surface, and the bottom surfaces of the holding slots are all located on a same horizontal plane; and after step S3, a bottom portion of each of the solders is correspondingly in contact with the bottom surface of each of the holding slots.

8. The method for manufacturing an electrical connector according to claim 1, wherein in step S4, the soldering portion protrudes from a lower surface of the insulating body, a standing leg is protrudingly provided downward from each of two sides of the lower surface of the insulating body, and a bottom end of the standing leg is lower than a lower end of the soldering portion and higher than a bottom end of each of the solders.

9. The method for manufacturing an electrical connector according to claim 1, wherein in step S4, an upper surface of the insulating body is downward concavely provided with a plurality of terminal slots, a lower surface of the insulating body is further upward concavely provided with a plurality of grooves corresponding to the terminal slots, a width of each of the grooves is greater than a width of each of the terminal slots, each of the terminals is fixed to a corresponding one of the terminal slots, the soldering portion of each of the terminals extends downward into a corresponding one of the grooves, a lower end of the soldering portion is higher than the lower surface of the insulating body, and each of the solders partially enters one of the grooves, so that the soldering portions are inserted into the solders.

10. The method for manufacturing an electrical connector according to claim 1, wherein in step S3, a temperature for heating the bearing tray is lower than a melting point of the solders.

11. The method for manufacturing an electrical connector according to claim 1, wherein in step S3, the bearing tray is heated by high-frequency current induction.

12. The method for manufacturing an electrical connector according to claim 1, wherein in step S1, the bearing tray is made of a solder-resistant plate material.

13. The method for manufacturing an electrical connector according to claim 1, wherein in step S1, each outer surface of the bearing tray is coated with a solder-resistant layer.

14. The method for manufacturing an electrical connector according to claim 1, wherein in step S4, each of the terminals defines a base portion fixed in the insulating body, an elastic contact portion bends upward and extends from the base portion and protrudes from an upper surface of the insulating body, a connection portion is downward protrudingly provided on the base portion and protrudes from a lower surface of the insulating body, the soldering portion is formed by extending downward from the connection portion, and the connection portion is provided with a siphon-proof structure.

15. The method for manufacturing an electrical connector according to claim 14, wherein the siphon-proof structure is an oxidation layer plated on a surface of the connection portion, or a solder mask layer coated on the surface of the connection portion.

16. The method for manufacturing an electrical connector according to claim 1, wherein after step S5, the electrical connector is soldered to a circuit board, and when the soldering portions are soldered and fixed to the circuit board, the soldering portions are correspondingly inserted into the solders at different depths.

17. The method for manufacturing an electrical connector according to claim 1, wherein after step S5, the electrical connector is soldered to a circuit board, and when the soldering portions are soldered and fixed to the circuit board, heights of the solders are different.

18. The method for manufacturing an electrical connector according to claim 1, wherein the solders are solder balls, solder bars or solder pastes.

\* \* \* \* \*